United States Patent
Heppner et al.

(10) Patent No.: US 6,816,247 B1
(45) Date of Patent: Nov. 9, 2004

(54) MOIRÉ METHOD AND A SYSTEM FOR MEASURING THE DISTORTION OF AN OPTICAL IMAGING SYSTEM

(75) Inventors: Joachim Heppner, Oberkochen (DE); Juergen Massig, Essingen (DE); Michael Arnz, Oberkochen (DE); Michael Kuechel, Oberkochen (DE); Juergen Penzing, Oberkochen (DE); Uwe Schellhorn, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 215 days.

(21) Appl. No.: 10/217,536

(22) Filed: Aug. 14, 2002

Related U.S. Application Data
(60) Provisional application No. 60/311,818, filed on Aug. 14, 2001.

(51) Int. Cl.[7] .................................................. G01B 9/00
(52) U.S. Cl. ...................................................... 356/124
(58) Field of Search .................................. 356/124–127

(56) References Cited

U.S. PATENT DOCUMENTS

| | | | | |
|---|---|---|---|---|
| 5,062,705 A | * | 11/1991 | Sato et al. | .................. 356/124 |
| 5,767,959 A | | 6/1998 | Kobayashi | |
| 5,973,773 A | | 10/1999 | Kobayashi | |
| 6,717,661 B1 | * | 4/2004 | Bernstein et al. | ........... 356/121 |

FOREIGN PATENT DOCUMENTS

EP    0 418 054 B1    9/1990

OTHER PUBLICATIONS

Claude Roddier and Francois Roddier, "Interferogram Analysis Using Fourier Transform Techniques", Applied Optics, vol. 26, No. 9, May 1987.

* cited by examiner

*Primary Examiner*—Frank G. Font
*Assistant Examiner*—Amanda Merlino
(74) *Attorney, Agent, or Firm*—Sughrue Mion, PLLC (57) ABSTRACT

In a moiré method for measuring the distortion of an optical imaging system in which and object grid having a two-dimensional object pattern is arranged in an object plane of the imaging system and an image grid having a two-dimensional image pattern is arranged in an image plane of the imaging system, these patterns are configured in the form of, for example cross-hatched patterns or checker board patterns, are adapted to suit one another such that a two-dimensional moiré fringe pattern that may be detected by a two-dimensional, spatially resolving, detection device is created when the object grid is imaged onto the image grid using the imaging system. Distortion components of the imaging system may be simultaneously determined along two differently oriented, in particular, two mutually orthogonal, image directions from a two-dimensional moiré fringe pattern.

22 Claims, 4 Drawing Sheets

MOIRÉ METHOD AND A SYSTEM FOR MEASURING THE DISTORTION OF AN OPTICAL IMAGING SYSTEM

The following disclosure is based on U.S. Provisional Application Ser. No. 60/311,818 filed on Aug. 14, 2001 which is incorporated into this application by reference.

BACKGROUND OF THE INVENTION

1. Field of the Invention

The invention relates to a moiré method for measuring the distortion of an optical imaging system and a system suitable for carrying out the method.

2. Description of the Related Art

Optical imaging systems are employed in numerous fields of engineering and research that impose increasingly stringent demands on their imaging quality. An example is photolithographic fabrication of semiconductor devices and other types of microdevices, where submicrometer-range structures are created using high-performance projection lenses. In semiconductor-device fabrication, imaging optics that have intolerably high distortion may, for example, cause defects in integrated circuits that will reduce yields of good integrated circuits and thereby increase fabrication costs. Such projection lenses have elaborate optical trains having large numbers of lenses that usually make it impossible to derive their optical characteristics from theoretical computations. The optical characteristics of their imaging systems must thus be reliably measured. The stringent demands on the imaging accuracies of their optical imaging systems impose even more stringent demands on the accuracies of the testing methods employed for checking their imaging systems. In particular, high-precision measurements of their distortion are absolutely essential.

Numerous testing methods for measuring the distortion of optical systems are based on exploitation of the moiré effect. For example, analyzing moiré fringe patterns created by linear grids in order to determine lens distortion along an image direction of a two-dimensional image field, in which a so-called "object grid" that has a transparent substrate bearing a large number of parallel, opaque lines that form an object pattern is arranged in the object plane of the imaging system to be tested, is known. An image grid having an image pattern similar to the object pattern is arranged in the lens' image plane. Both grids are arranged such that they are orthogonal to the optical axis of the imaging system. The object pattern and the image pattern are adapted to suit one another such that a moiré pattern exhibiting moiré fringes is created when the object pattern is imaged onto the image pattern using the imaging system.

Creation of a moiré fringe pattern may be achieved by accurately matching the ratio of the grid constants of the image grid and object grid to the lens' prescribed magnification. Rotating one of these grids with respect to the other grid about the optical axis will then create a moiré pattern consisting of bright and dark fringes running nearly orthogonal to the grid lines on the object and image grids. The number of pairs of fringes created is equal to the number of grid lines of one grid that intersect a grid line of the other grid. A moiré fringe pattern may also be created by slightly altering the grid constants of the object grid and image grid, for example, altering them by a few percent, duly allowing for the image magnification involved. Moire methods of this type are described in, for example, U.S. Pat. No. 5,767,959, or U.S. Pat. No. 5,973,773, which has a substantially identical content.

Lens distortion, which is usually small compared to the grid constant of the image grid, may, for example, be determined by phase shifting, in which various moiré fringe patterns, each of which is created by progressively shifting grids with respect to one another parallel to their grid lines by a fraction of their grid period, are recorded by a camera. A periodic change in intensity is observed at each image location during this phase shifting. The relative phase of these signals at various measurement locations is a measure of lens distortion orthogonal to the grid lines.

The aforementioned method allows determining distortion along a single image direction, namely, that orthogonal to the grid lines, only. If distortion components along other image directions are to be determined, the lens is normally rotated about its axis through, for example, 90°, before any further measurements are performed, which requires employment of a mechanically complex measurement setup.

European Patent No. EP 0 418 054 describes another moiré method that allows initially determining the distortion components along an image direction and then determining the distortion components along an image direction orthogonal thereto in two consecutive steps, where, in the case of one embodiment, the object grid bears a two-dimensional object pattern in the form of a cross-hatched pattern. The image grid, on the other hand, is one-dimensional and has a set of parallel lines. Moreover, the projection lens whose distortion is to be measured is equipped with a translatable pupil filter that may be used to transmit either the first-order diffracted reflections in the x-direction or those in the y-direction and block all other reflections. Switching between the measurement directions involves both translating the pupil filter and rotating the image grid through 90°. This system thus allows dispensing with rotating the lens. However, it necessitates an intervention into the projection lens in order to incorporate a suitable pupil filter and construction of an elaborate mount for the image grid that will allow rotating the image grid through 90°.

SUMMARY OF THE INVENTION

It is one object of the invention to provide a moiré method and an associated measuring system that will allow rapid, reliable, two-dimensional distortion measurements, i.e., distortion measurements along several, differing, image directions, while maintaining the mechanical requirements imposed on the measurement system low. It is another object to provide a moiré method and measuring system that allow simultaneously measuring the distortion components of an imaging system along two mutually orthogonal image directions.

As a solution to these and other objects the invention provides a moiré method for measuring the distortion of an optical imaging system comprising:

arranging an object grid having a two-dimensional object pattern in an object plane of the imaging system; arranging an image grid having a two-dimensional image pattern in an image plane of the imaging system; wherein the object pattern and image pattern are adapted to suit one another such that a two-dimensional moiré fringe pattern may be created when the object pattern is imaged onto the image pattern using the imaging system;

imaging the object pattern onto the image pattern in order to create a two-dimensional moiré fringe pattern;

detecting the two-dimensional moiré fringe pattern;

determining at least one first distortion component and at least one second distortion component from the two-dimensional moiré fringe pattern, where the first distortion component is correlated to a first image direction of an image plane and the section distortion component is correlated to a second image direction transverse to the first image direction.

An associated system for making two-dimensional measurements of both distortion components comprises an object grid having a two-dimensional object pattern arranged in an object plane, an image grid having a correspondingly adapted two-dimensional image pattern arranged in an image plane, devices for imaging the object pattern onto the image pattern and for detection the two-dimensional moiré fringe pattern created, and a device for determining the first and second distortion components from the moiré fringe pattern.

To be interpreted as a "two-dimensional pattern" in the sense of this application are both the pattern itself, which is extended in two dimensions, and the pattern's spectrum, which is also extended in two dimensions, i.e., is modulated in two dimensions. In other words, a "two-dimensional pattern" refers to both the field and the pupils.

A preferred setup provides that the object grid will be irradiated using an illumination device and that radiation modified by the object pattern will be imaged onto the image grid by the imaging system. Suitable grids may be, e.g., transmission gratings, phase gratings, or reflection gratings, depending upon the application involved. A preferred device for detecting the two-dimensional moiré fringe pattern is thus a two-dimensional detector, for example, a detector equipped with a CCD-chip, for detecting superimposed images of the object pattern and image pattern. Although other imaging optics are preferably incorporated between the image grid and object grid, they may be omitted.

In principle, the method according to the invention allows determining two mutually orthogonal, or, in general, several, distortion components of a lens correlated to differing image directions from a single, detected, two-dimensional moiré fringe pattern. It is thus highly unlikely that temporal variations of the measurement setup, which can be critical, particularly in the case of phase-shift measurements, will cause erroneous measurement results.

The object pattern and image pattern are preferably present in the form of a superposition of two mutually orthogonal line gratings, e.g., a cross-hatched pattern or a checker-board pattern. Rotating the image grid relative to the object grid, or vice versa, preferably about the optical axis of the measuring system, will then lead to creation of two-dimensional moiré fringe patterns that are largely periodic along two mutually orthogonal image directions, and from which the distortion components correlated to the first and second image directions may be extracted. Fringe width and fringe spacing may be adjusted by adjusting the rotation angle, which will allow, for example, adapting them to suit the resolving power of a camera provided for the purpose of recording the moiré fringe pattern.

Analysis of the information contained in the two-dimensional moiré fringe pattern, from which, e.g., distortion components along two mutually orthogonal directions may be derived, may be complicated by crosstalk among moiré components. In order to arrive at unambiguous segregations of the imaging information that are uniquely correlated to image directions, a Fourier transform of the moiré fringe pattern may be initially computed in order to determine a frequency spectrum along the first and/or second image direction. Subsequent filtering of a range about a fundamental frequency of the frequency spectrum along the associated image directions yields a filtered frequency spectrum. This filtering suppresses DC signal components and ripple, which improves signal quality. Subsequent inverse transformation of the filtered frequency spectrum to the spatial domain yields the desired phases, to within factors of integral multiples of $2\pi$, which will be largely free of effects due to the other image direction. Eliminating the $2\pi$ phase jumps allows deriving the relative phases along the image directions, which are a measure of the distortion components.

Phase discontinuities at the perimeter of the image field may lead to frequencies that are not actually present in the moiré fringe pattern and thus to analytical errors that may affect the entire image field. In order to avoid these phase discontinuities and eliminate any dependence of the results obtained on the particular shape of the, usually circular, image to be measured, under a preferred embodiment of the method, the moiré fringe pattern present in an image field is continuously extrapolated into a, preferably square, analysis zone surrounding the image field. The original moiré fringe pattern detected is inserted into this continuously extrapolated image in the form of a partial image, yielding image information that is readily analyzable in an analysis window whose central portion is largely taken up by the original moiré fringe pattern detected that has been continuously extrapolated outward to the perimeter of the analysis window. An algorithm that may be employed for this purpose is known as the "Gerchberg algorithm," and is described in the article C. Roddier and F. Roddier: "Interferogram analysis using Fourier transform techniques," *Applied Optics* 26, 9 (1987). A variation thereon that has been optimized for use with the invention will be described in detail below in conjunction with the description of sample applications.

Another embodiment of the method effects an improvement in signal/noise ratio by superimposing at least two, temporally consecutively detected, moiré fringe patterns to form an additive moiré fringe pattern and using this additive moiré fringe pattern as a basis for further analysis.

Since it is to be expected that the method's residual systematic analytical errors will vary periodically with the initial phase, a preferred embodiment of the method involves employing moiré fringe patterns having at least two, differing, initial phases, phase relations, or relative locations between the object and image patterns for determining individual phase distributions, detecting these, at least two, moiré fringe patterns, and subsequently averaging them over these individual phase distributions. Averaging over, for example, four phase intervals employing, ideally, increments of $\pi/2$, has proven adequate. However, it may also be beneficial to average over a larger number of phase intervals, for example, 8, 16, or 32 phase intervals, and employ correspondingly smaller increments, which will allow avoiding phase-related analytical errors.

The method's spatial resolution may be improved by employing a two-dimensional detector having a two-dimensional array of rows and columns of image sensors for detecting moiré fringe patterns arranged with respect to the moiré fringe pattern such that the fringes of the moiré fringe pattern are oriented transversely to, in particular, run diagonally across, the rows and columns of image sensors, which will allow achieving spatial resolutions better than the detector's nominal spatial resolution, which, for this type of detector, is given by the vertical separation of neighboring image sensors, in a simple manner.

The aforementioned and other characteristics of the invention are as stated in the accompanying claims, description, and figures, where those individual characteristics depicted may represent themselves alone or several

BRIEF DESCRIPTION OF THE DRAWINGS

FIG. 4 is a plot of the frequency spectrum of the moiré fringe pattern shown in

FIG. 3 obtainable by taking the Fourier transform of that moiré fringe pattern;

FIG. 7 is a plot of the frequency spectrum of the moiré fringe pattern shown in

FIG. 6 obtainable by taking the Fourier transform of that moiré fringe pattern.

DETAILED DESCRIPTION OF THE PREFERRED EMBODIMENTS

In the following, the invention will be described based on measurement of the distortion of a microlithographic projection lens. However, it is also applicable to measuring the distortions of other types of optical imaging systems, such as photographic lenses or similar. The system 1 depicted in FIG. 1 for measuring the distortion of a projection lens 2 comprises an object grid 3 arranged in the object plane of the projection lens 2 and an image grid 4 arranged in the image plane of the projection lens. Each of those grids 3 and 4 is orthogonally oriented with respect to the optical axis 5 (z-axis) of the measuring system, which is to be aligned parallel to the optical axis of the projection lens 2 and, in the case of the example shown, coincides with that optical axis. The image grid 4 is translatable over the x-y plane, which is orthogonal to that optical axis, and is mounted such that it may be rotated about an axis parallel to that optical axis, where a manipulation device, which is not shown here, incorporating a translation stage and a rotation stage is provided for that purpose. Suitable translation and rotation stages may also, or alternatively, be assigned to the object grid. A schematically depicted illumination device 6 is arranged on that side of the measuring system that faces away from the projection lens. A device 7 for detecting a moiré fringe pattern created in the image plane that, in the case of the example shown, comprises imaging optics 8 and a two-dimensional detector 9, is located on that side of the image grid 4 that faces away from the projection lens 2. A controller for the measuring system, which is not shown here, comprises devices for translating the image grid 4 over the x-y plane and rotating it therein and an image-analysis device equipped with image-analysis software suitable for image processing, whose operation will be described in detail below, connected to the detection device 7.

Figure 1:
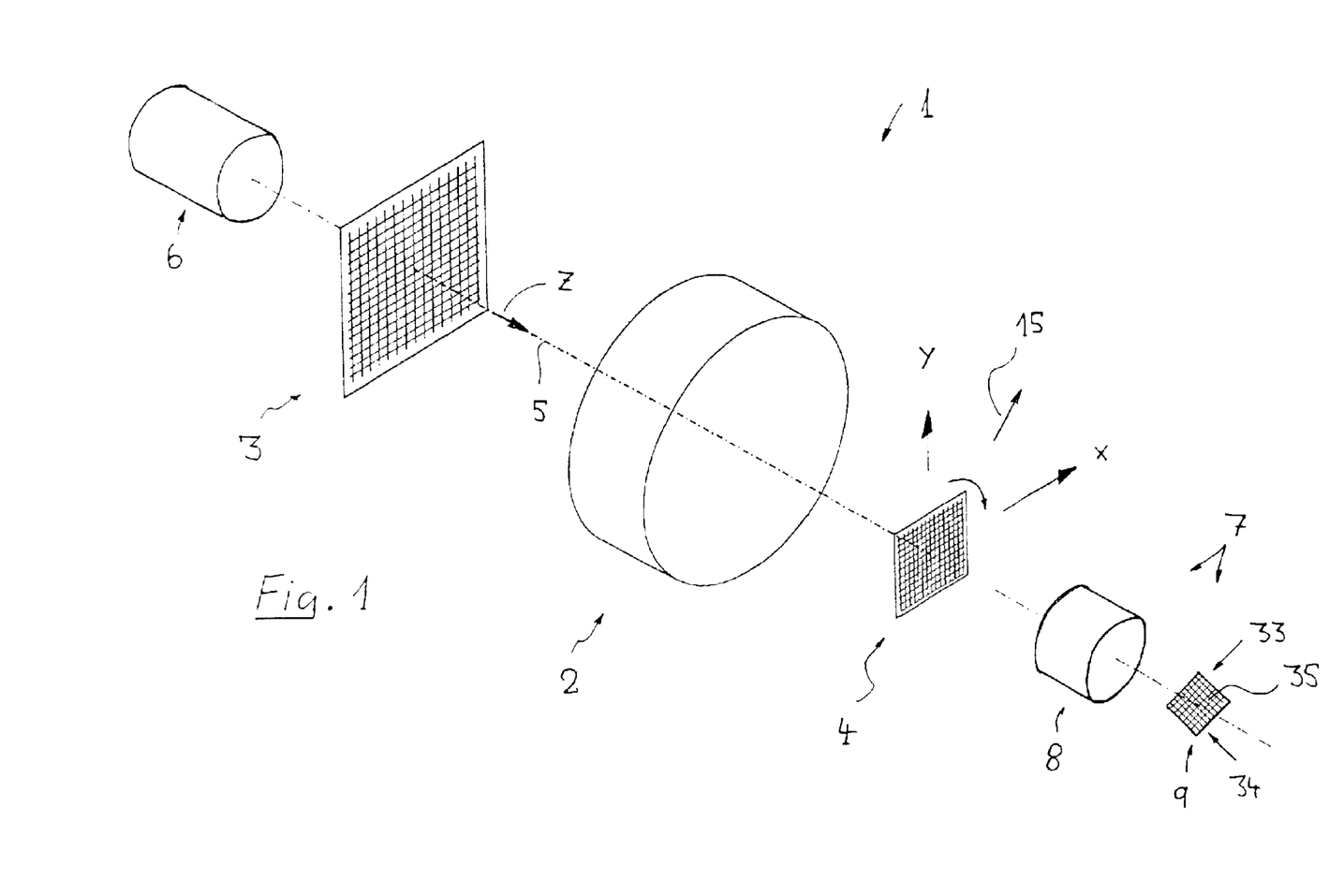
FIG. 1 is a schematized perspective view of an embodiment of a system according to the invention for measuring the distortion of a photolithographic projection lens.

The projection lens 2 will image the object pattern onto the image pattern arranged in its image plane and superimpose the former on the latter in order to, in this manner, create a two-dimensional moiré fringe pattern when the object grid 3 is illuminated using the illumination system 6. The imaging optics 8 will image this superposition onto the detector 9, which will allow analyzing the image.

Figure 2:
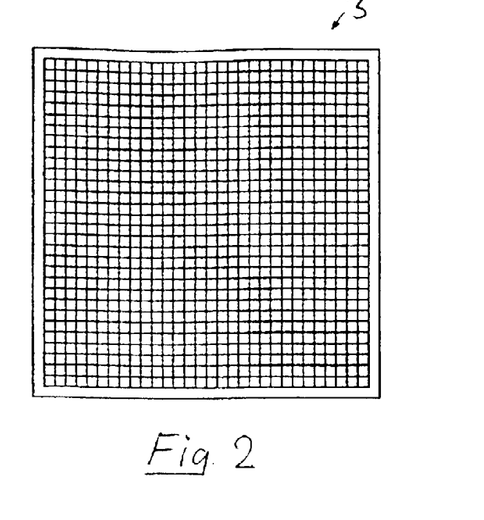
FIG. 2 is an embodiment of an object grid having a two-dimensional object pattern in the form of a cross-hatched pattern.

The object grid 3 bears a two-dimensional object pattern in the form of a cross-hatched pattern (cf. FIG. 2) consisting of two mutually orthogonal sets of equidistant, parallel lines. More precisely, the object grid consists of a transparent substrate, for example, a quartz plate, to which opaque, for example, chromium, lines have been applied. In addition to transmission gratings, phase gratings or reflection gratings may also be employed. The similarly configured image grid bears a two-dimensional image pattern in the form of a cross-hatched pattern. In the case of this example, the ratio of the grid constants of the image grid and object grid is exactly equal to the magnification of the projection lens 2, which adapts the object grid and image grid to suit one another such that a two-dimensional moiré fringe pattern may be created when the object pattern is imaged onto the image pattern by the projection lens 2. In practice, this is accomplished by rotating one of the grids, e.g., the image grid 4, about the z-axis, relative to the other grid 3. The resultant moiré fringe pattern 10 (cf. FIG. 3) consists of two largely mutually orthogonal patterns of bright and dark fringes, each of which is roughly orthogonal to the grid lines of the cross-hatched pattern (cf. FIG. 2) that created them. For example, the lines of the cross-hatched pattern shown in FIG. 2 running along the y-direction create a set of bright and dark fringes running along the x-direction in the moiré fringe pattern (cf. FIG. 3), where the number of fringe pairs equals the number of lines of one grid that intersect a grid line of the other grid. In the case of the approach described here, that number will depend upon the grid constants of the object grid and image grid and the angle through which these grids have been rotated with respect to one another.

A special feature of this method is that it allows employing two-dimensional patterns in both the object plane and image plane that allow deriving the distortion components of the lens 2 along two mutually orthogonal (x and y) image directions from a single superimposed image, namely, a moiré fringe pattern that is largely periodic along two image directions, without necessity for, for example, rotating the lens 2 about its optical axis.

Unlike conventional methods, which employ one-dimensional grids, methods of the type described here as examples that employ two-dimensionally constructed grids that are two-dimensional at the pupils are not simple to treat when it comes to image analysis. Errors in the desired highly accurate determination of two, or more, mutually independent distortion components will be virtually unavoidable due to a disturbing crosstalk among the moiré components. In order to avoid these errors, the preferred method determines the lens' distortion by means of a single iteration of a two-dimensional Fourier transform of the image information contained in the original moiré fringe pattern 10 that proceeds as described below.

Figure 3:
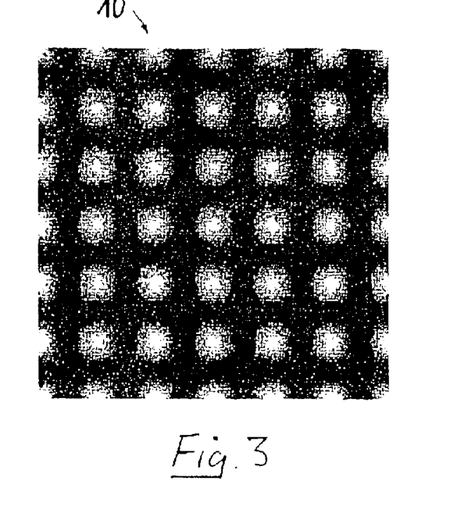
FIG. 3 is an example of a two-dimensional moiré fringe pattern obtainable using rotated cross-hatched patterns.

The intensity I(x, y) of the moiré fringe pattern 10 detectable by the detector 9 may be written as follows:

$$I(x, y) = a(x, y) + c_x(x, y) + c_x^*(x, y) + c_y(x, y) + c_y^*(x, y), \tag{1}$$

Where $c_x(x, y)$ and $c_y(x, y)$ describe the fundamental waves of the intensity modulation of the moiré fringe pattern in accordance with the following equations:

$$c_x(x, y) = \tfrac{1}{2} b_x(x, y) \exp[j\Phi_x(x, y)], \quad (2)$$

$$c_y(x, y) = \tfrac{1}{2} b_x(x, y) \exp[j\Phi_y(x, y)], \quad (3)$$

where the parameter $b_x(x, y)$ is the amplitude and the parameter $(D(x, y)$ is the phase of the fundamental wave along the respective direction, $j=\sqrt{-1}$, and * indicates the complex conjugate.

The frequency spectrum of the spatial moiré fringe pattern is computed from this spatial intensity distribution over the x-y image plane by means of an initial, discrete, Fourier transform. The resultant spectrum of discrete frequencies, $f_x$ and $f_y$, in spatial-coordinate-frequency space is plotted in FIG. 4 for the case of the moiré fringe pattern 10 shown in FIG. 3, and is given by the following equation:

$$I(f_x, f_y) = A(f_x, f_y) + C_x(f_x, f_y) + C_x(-f_x, -f_y)^* + C_y(f_x, f_y) + C_y(-f_x, -f_y)^*, \quad (4)$$

Figure 4:
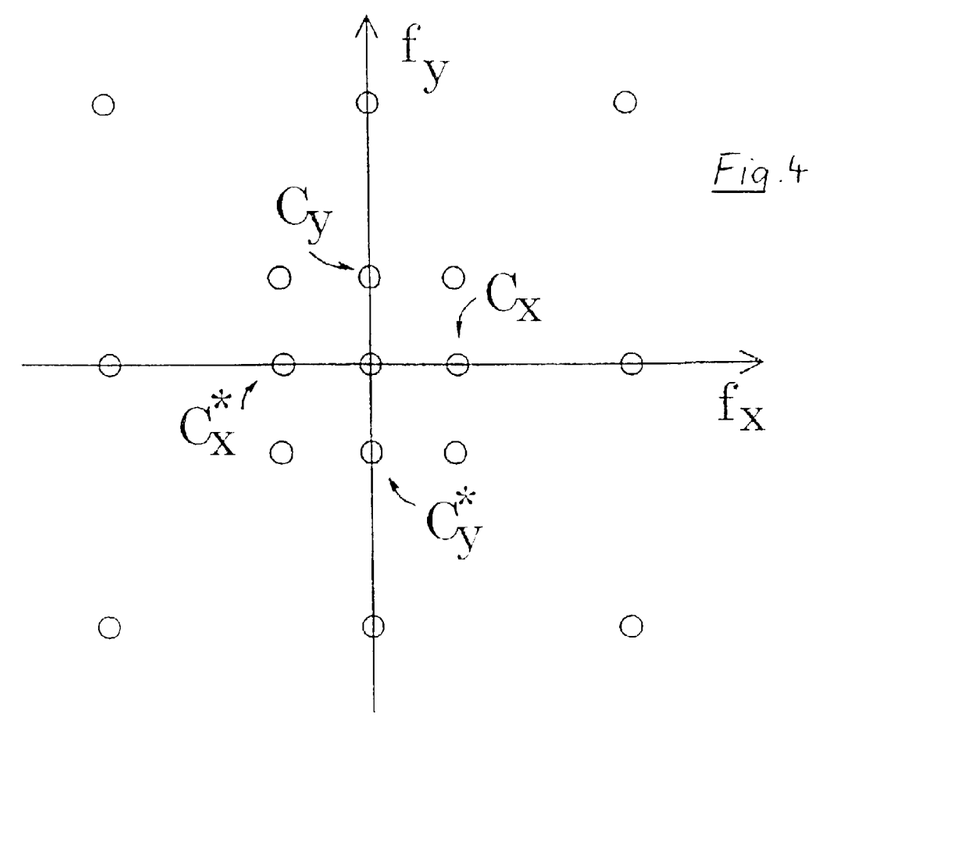

Here A describes the uniform-intensity portion of the moiré fringe pattern in the neighborhood of 0-frequency. The phase information of interest along the x-direction and y-direction is redundantly contained in the two spectral ranges, $C_x$ and $C_x^*$, and $C_y$ and $C_y^*$, both of which are symmetrically disposed about the origin. One of these spectral ranges, $C_x(f_x, f_y)$ and $C_y(f_x, f_y)$, will be individually filtered out of the spectrum. This filtering suppresses DC-components and ripple and allows separating image information along the two image directions. The filtered frequency spectrum obtained in this manner is inverse-transformed to spatial-coordinate space in order to determine the phase distribution. The arguments of the inverse-transformed, complex, moiré-fringe-pattern parameters will then, to within integral multiples of $2\pi$, be the desired phases of the fundamental waves, which may be written as:

$$\Phi_x(x, y) = \arg[c_x(x, y)]. \quad (5)$$

$$\Phi_y(x, y) = \arg[c_y(x, y)]. \quad (6)$$

The phases obtained in this manner contain jump discontinuities. Once these jump discontinuities have been eliminated in a manner known to specialists in the field and the carrier phase has been eliminated by matching planes, the two phase functions, $\Phi_x(x, y)$ and $\Phi_y(x, y)$, may be obtained from the respective associated components of the distortion vector.

In principle, the method also allows determining the desired phase information from a single "frozen" image (two-dimensional moiré fringe pattern) employing a Fourier transform. None of the phase shifting frequently employed by conventional moiré methods will be required.

Figure 5:
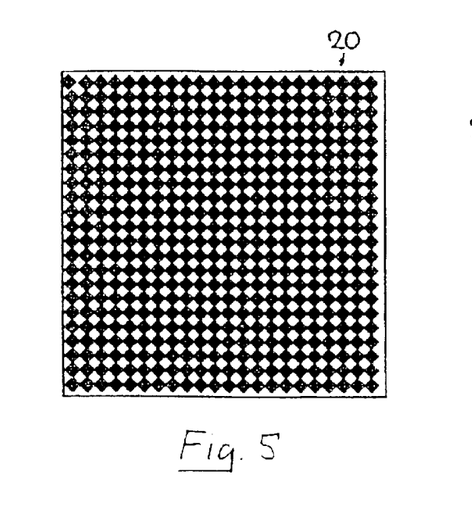
FIG. 5 is an embodiment of an object grid having a two-dimensional object pattern in the form of a checker-board pattern.
Figure 6:
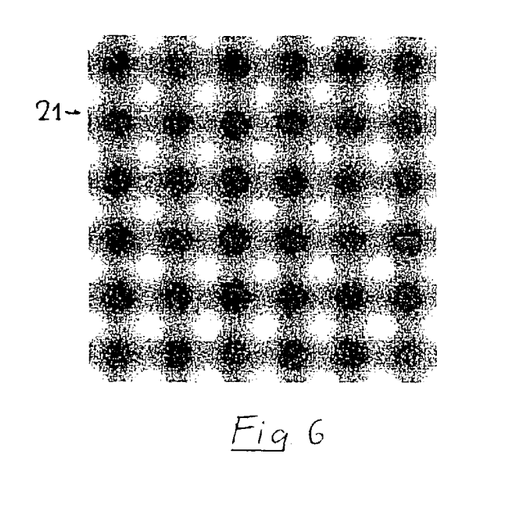
FIG. 6 is an example of a two-dimensional moiré fringe pattern obtainable using rotated checker-board patterns.
Figure 7:
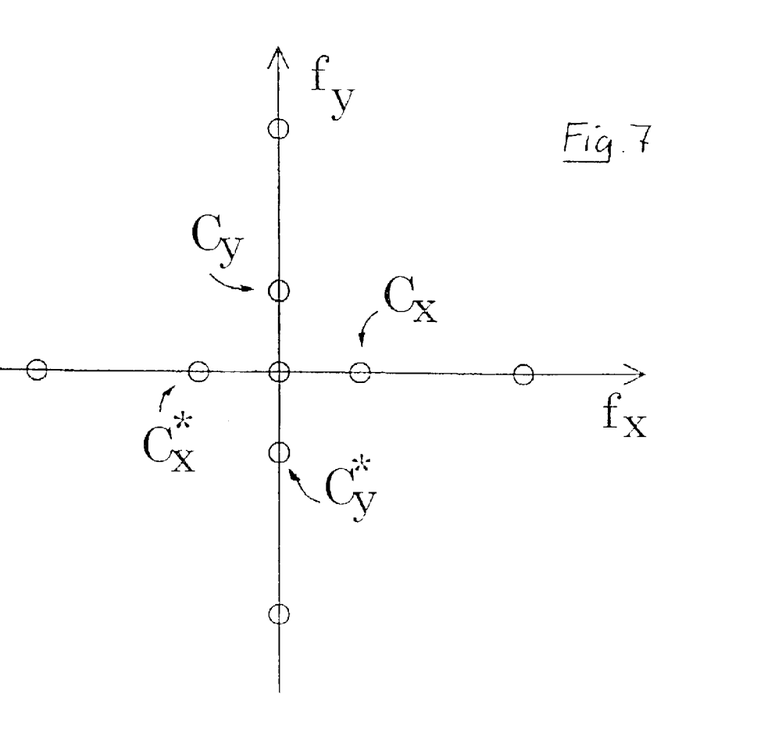

The method that has been explained based on the example of a linear cross-hatched pattern may also be analogously employed using other types of two-dimensional object and image grids that have been adapted to suit one another. As an example, FIG. 5 depicts a two-dimensional object grid in the form of a checker-board pattern 20 consisting of an array of rows and columns of alternately transparent and opaque squares. A moiré fringe pattern 21 created by shifting such checker-board patterns relative to one another, from which a clear-cut separation of the image information on the distortion components along the x-direction and y-direction contained in the moiré fringe pattern 21 may be obtained via filtering and inverse transformation in a manner analogous to that described above, is depicted in FIG. 6. One advantage of employing checker-board patterns compared to linear grids similar to that depicted in FIG. 3 is that, in this case, no mixed frequencies, i.e., frequencies falling within the squares, occur. Another advantage is that the contrast does not drop to zero anywhere on the image.

Figure 8:
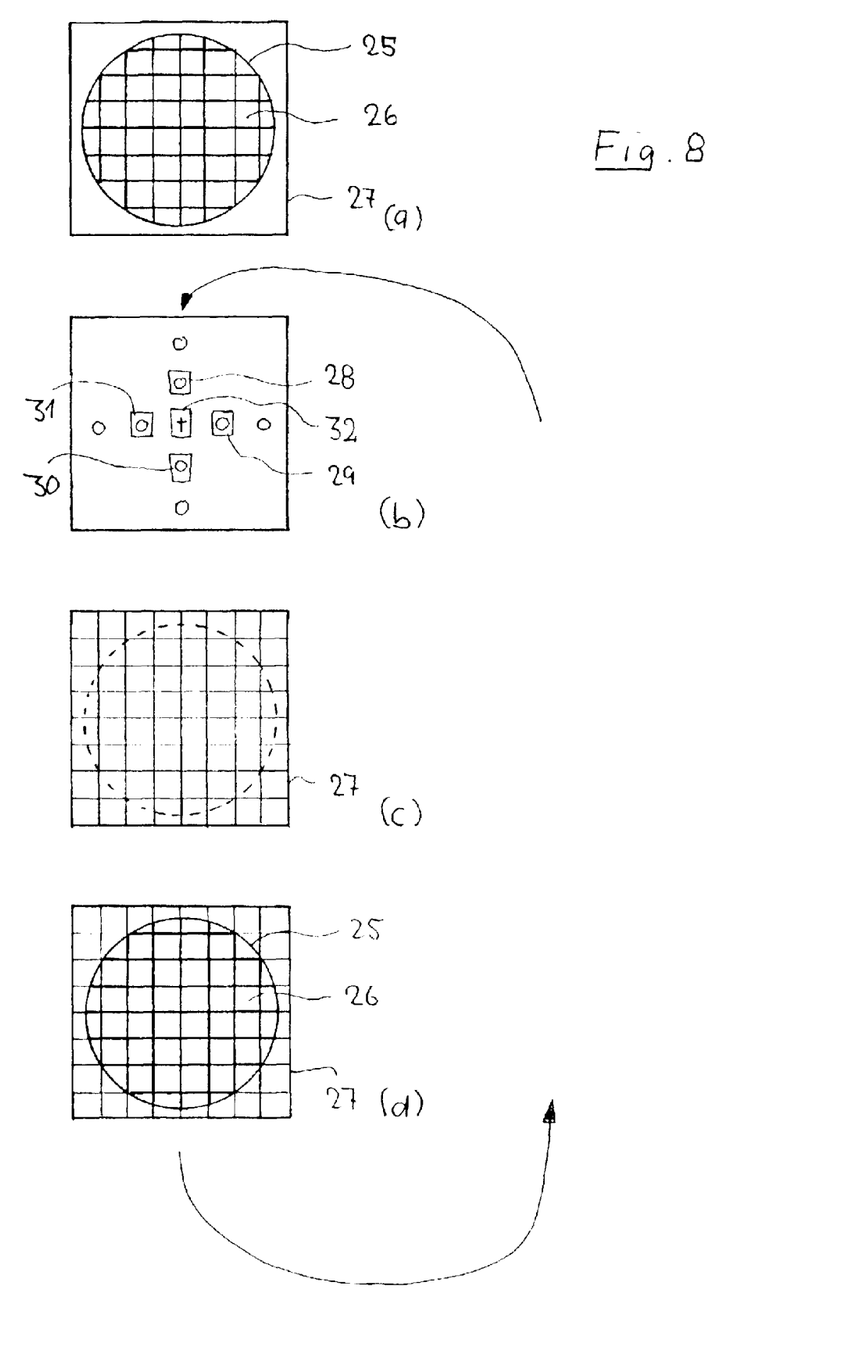
FIG. 8 is a schematized representation of the steps involved in continuously extrapolating the image information of a circular image field into a square analysis zone in order to avoid cutoff effects.

The method described above yields highly accurate phases and distortion components, provided that the moiré fringe pattern has an integral number of periods occurring within the confines of the transformed image field. Otherwise, phase discontinuities at the perimeter of the image will lead to analytical errors that may affect the entire image field. In order to avoid these errors and thereby obtain results that will be independent of the particular form of the original image to be measured, in the case of the preferred embodiment a, for the analysis, beneficial, continuous extrapolation of the original moiré fringe pattern present in the image field into a rectangular analysis zone surrounding the image field is performed and the original moiré fringe pattern recorded subsequently inserted into this analysis zone in the form of a partial image. FIG. 8 depicts schematic representations of the various steps involved in this procedure.

FIG. 8(a) depicts the circular image field 25 and its two-dimensional moiré fringe pattern 26 displayed in a square analysis window 27 that is symmetrically disposed about the image field. Fourier transforming the moiré fringe pattern 26 yields the Fourier spectrum shown in FIG. 8(b), which has spatial frequencies corresponding to the orthogonal image directions, where two symmetric frequency peaks are shown for each frequency. Narrow-band filtering of the Fourier spectrum over a range about the carrier frequencies 28–31 and about the DC-component 32 yields a filtered Fourier spectrum. This filtering eliminates extraneous frequencies, in particular, those that arise from cutoff effects at the perimeter of the image field 25. Inverse transforming the filtered Fourier spectrum yields the extrapolated moiré fringe pattern plotted in FIG. 8(c), which covers the entire analysis zone 27 and is continuously extrapolated in all spatial directions beyond the perimeter of the image field 25, which is indicated by the dotted line. Since this inverse transform also modifies image information obtained from the original moiré fringe pattern 26 that is essential to the analysis, a section of the analysis zone corresponding to the image field 25 is replace by the original moiré fringe pattern 26 in a final step (cf. FIG. 8(d)). Replacing the modified moiré fringe pattern appearing in vicinity of the central partial image by the original moiré fringe pattern 26 returns the full content of the image information contained in the original moiré fringe pattern 26 to the analytical procedures. These data-processing steps are preferably iterated several times in order to keep transitions due to the incorporation of phase information from outside the original image field particularly smooth. The important thing to be observed in this iterative procedure is that the partial image incorporating the original moiré fringe pattern recorded and the distortion information contained therein must remain unaltered throughout.

The multifringe algorithm presented here allows, in principle, determining two orthogonal distortion components of a lens from a single two-dimensional moiré fringe pattern recorded by a two-dimensional detector 9, for example, a camera. Temporal variations in the measurement setup, which can be critical in the case of phase-shift measurements, play a minor role only. In order to improve the signal/noise ratio, several images recorded for the same relative positions of the grids may be added and the cumulative moiré fringe pattern analyzed.

Alternatively thereto, or in addition thereto, it may be sensible to average the phase function over several positions of the grids, since it is to be expected that residual systematic errors will vary periodically with grid position. Averaging over four grid positions in increments of one-quarter grid period in each case has proven beneficial. This phase averaging should preferably act on both moiré components simultaneously in order that the relative displacement 16 chosen will preferably be along the diagonals bisecting the x-direction and y-direction. This relative displacement of the grids 3 and 4 in order to set various phase relations should be clearly distinguished from phase shifting. In the latter case, phase shifting is necessary in order to be able to determine, point by point, those phases needed for determining distortion components along the displacement direction. In the case of the invention, distortion components may be determined from individual images. Averaging over various initial phases merely serves to preclude prospective sources of errors.

The spatial resolution of the multifringe method presented here depends upon the total number, f, of moire periods arranged to appear in the image field, which may be set by varying grid constants and the angle of rotation of the grids relative to one another. If the first harmonic (2f) occurs in the frequency spectrum, then four or more image elements will have to be detected by a two-dimensional detector per moiré period before this harmonic may be filtered out of the spectrum. Detection of six image elements per moiré period will be required if, e.g., the second harmonic (3f) also must be suppressed, which means that detection of n/5 moiré periods will have to be set for image dimensions of n×n detection points, or pixels in the plane of the detector.

The above applies when the moiré fringes involved are largely aligned parallel to the rows 33 and columns 34 of image sensors 35 of the two-dimensional detector 9. Spatial resolution may be improved in a simple manner by providing that the moiré fringes will be transverse to, in particular, will run diagonally across, the array of image sensors, as has been schematically indicated in FIG. 1, which will allow setting $\sqrt{2}(n/5)$ moiré periods to be detected and analyzed for an image field of the same diameter.

In the case of high-precision distortion measurements, it will be beneficial to compensate for the effects of errors due to imperfect grids 3 and 4. Except for errors in their grid constants and orthogonality errors of the two sets of parallel lines of their two-dimensional grids, grid errors may be measured separately for each set of parallel lines using a high-resolution interferometer. Accurately compensating for grid errors will be possible if the error spectra are processed using the same filter bandwidth used for determining the phases of the moiré spectra. The grids' relative scales and orthogonality errors may be determined by measuring lens distortion, with the grids rotated through various angles with respect to one another, in increments of 90°.

In those cases where imaging optics 8 situated between the image grid and the detector are employed in order image the two-dimensional moiré fringe pattern imaged onto the image plane onto an image-detection device, it will be beneficial to measure any potential distortion of the moiré fringe pattern due to the former imaging. Distortion of an imaging system that images a moiré fringe pattern onto a detector may be determined by, for example, determining the moiré fringe pattern once by rotating the two grids relative to one another in order to yield a first rotation direction, determining it again with the grids rotated with respect to one another in opposite direction while maintaining the moiré period constant, and then adding the two phase functions obtained for the two vector components involved. Distortion due to the imaging optics may be derived from the sum of two measurements. The difference in the two measurements contains information on lens distortion and any grid errors that may be present.

The distortion of the imaging optics 8 may also be measured using a test pattern, for example, a checker-board pattern whose period is comparable to the period of the moiré fringe pattern to be measured. In order to allow accurately aligning the test pattern along the z-direction, transparent sections of the template bearing the test pattern may be provided with arrays of grid patterns that will allow creating a moiré fringe pattern, along with the image of the object grid.

The invention has been explained based on two-dimensional patterns (object grids, image grids, and moiré fringe patterns) that have two mutually orthogonal periodicity directions. However, two-dimensional patterns having more than two periodicity directions, e.g., patterns having threefold symmetry, or patterns having nonorthogonal periodicity directions, may also be utilized.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

What is claimed is:

1. A moiré method for measuring the distortion of an optical imaging system comprising:

arranging an object grating having a two-dimensional object pattern in an object plane of the imaging system;

arranging an image grating having a two-dimensional image pattern in an image plane of the imaging system;

wherein the object pattern and the image pattern are adapted to suit one another such that a two-dimensional moiré fringe pattern is created when the object pattern is imaged onto the image pattern by the imaging system;

imaging the object pattern onto the image pattern in order to create a two-dimensional moiré fringe pattern;

detecting the moiré fringe pattern; and determining at least one first distortion component and at least one second distortion component from the two-dimensional moiré fringe pattern, wherein the first distortion component is correlated to a first image direction of an image plane and the second distortion component is correlated to a second image direction of that image plane that is transverse to the first image direction.

2. A moiré method according to claim 1, wherein a rotation of the image grating relative to the object grating is performed in order to create the two-dimensional moiré fringe pattern.

3. A moiré method according to claim 1, wherein distortion components of an optical imaging system are simultaneously determined along two mutually orthogonal image directions.

4. A moiré method according to claim 1, the determination of distortion components further comprising:

Fourier transforming the two-dimensional moiré fringe pattern in order to determine a frequency spectrum of the moiré fringe pattern along at least one of the first image direction and the second image direction;

filtering an area around a fundamental frequency of the frequency spectrum along each of the image directions involved in order to determine a filtered frequency spectrum correlated to each image direction;

inverse transforming the filter frequency spectrum in order to determine phase factors; and determining distortion components along the image directions from the phase factors.

5. A moiré method according to claim 1, wherein a continuous extrapolation of the two-dimensional moiré fringe pattern present in an image field into an analysis zone surrounding the image field is performed in order to determine distortion components of the two-dimensional moiré fringe pattern, wherein the following steps are performed at least once:

Fourier transforming the original moiré fringe pattern present in an image field in order to determine a frequency spectrum of the moiré fringe pattern;

filtering the frequency spectrum over the range of carrier frequencies and uniformly illuminated portion in order to determine a filtered Fourier spectrum;

inverse transforming the filtered Fourier spectrum in order to generate an extrapolated moiré fringe pattern that covers the analysis zone; and replacing a section of the extrapolated moiré fringe pattern corresponding to the image field by the original moiré fringe pattern.

6. A moiré method according to claim 5, wherein at least one of the steps is repeated at least once.

7. A moiré method according to claim 1, further comprising:

superimposing at least two, chronologically consecutively detected, two-dimensional moiré fringe patterns in order to form an additive moiré fringe pattern; and analyzing the additive moiré fringe pattern.

8. A moiré method according to claim 1, further comprising:

shifting the object pattern and image pattern relative to one another along a direction orthogonal to the optical axis of the imaging system in order to create two-dimensional moiré fringe patterns having differing phases.

9. A moiré method according to claim 8, wherein the following steps are performed:

detecting two-dimensional moiré fringe patterns having at least two differing relative positions between the object pattern and the image pattern in order to determine phase distributions that depend upon their original phases;

averaging over at least two of those phase distributions in order to determine an averaged phase distribution; and determining distortion components from the averaged phase distribution.

10. A moiré method according to claim 8, wherein the shifting of the object pattern and image pattern relative to one another is performed along a direction transverse to the periodicity directions of the image pattern and object pattern.

11. A moiré method according to claim 8, wherein the object pattern and the image pattern have mutually orthogonal periodicity directions, and wherein the shifting of the object pattern and image pattern relative to one another is performed in a direction diagonal to their periodicity directions.

12. A measuring system for measuring the distortion of an optical imaging system using moiré fringe patterns, the measuring system comprising:

an object grating having a two-dimensional object pattern arranged in an object plane of the imaging system;

an image grating having a two-dimensional image pattern arranged in an image plane of the imaging system;

wherein the object pattern and image pattern are adapted to suit one another such that a two-dimensional moiré fringe pattern is created when the object pattern is imaged onto the image pattern using the imaging system;

devices imaging the object pattern onto the image pattern in order to create a two-dimensional moiré fringe pattern;

devices for detecting the two-dimensional moiré fringe pattern; and a device determining at least one first distortion component and at least one second distortion component from the two-dimensional moiré fringe pattern, wherein the first distortion component is correlated to a first image direction of an image plane and the second distortion component is correlated to a second image direction of that image plane that is transverse to the first image direction.

13. A measuring system according to claim 12, wherein the object pattern or image pattern is formed by superimposing two mutually orthogonal line gratings.

14. A measuring system according to claim 12, wherein the object pattern or the image pattern are configured as a checker board grating.

15. A measuring system according to claim 12, wherein the image grating and object grating are at least one of rotated and rotatable relative to one another.

16. A measuring system according to claim 12, further comprising a shifting device shifting the object pattern and image pattern relative to one another along a shifting direction parallel to the measuring system's object plane or image plane.

17. A measuring system according to claim 16, wherein the shifting direction is aligned transverse to a first periodicity direction and a second periodicity direction of the object pattern and the image pattern.

18. A measuring system according to claim 17, wherein the object pattern and image pattern have mutually orthogonal periodicity directions, and wherein the direction along which the patterns are shifted is diagonal to the periodicity directions.

19. A measuring system according to claim 12, wherein the device imaging the object pattern onto the image pattern has:

an illumination device arranged on that side of the object grating that faces away from the imaging system; and a device detecting the two-dimensional moiré fringe pattern arranged on that side of the image grating that faces away from the imaging system.

20. A measuring system according to claim 19, wherein the device detecting the two-dimensional moiré fringe pattern has a two-dimensional detector having numerous image sensors detecting image intensity at locations on the two-dimensional moiré fringe pattern.

21. A measuring system according to claim 20, wherein the detector has rows and columns of image sensors that are aligned transverse to the periodicity directions of the two-dimensional moiré fringe pattern.

22. A measuring system according to claim 12, wherein the device determining distortion components has a computer unit that is configured for performing the following steps on a two-dimensional moiré fringe pattern:

determining at least one first distortion component and at least one second distortion component from the two-dimensional moiré fringe pattern, wherein the first distortion component is correlated to a first image direction of an image plane and the second distortion component is correlated to a second image direction of that image plane that is transverse to the first image direction.

* * * * *